United States Patent
Marraccini et al.

(10) Patent No.: US 7,936,292 B2
(45) Date of Patent: May 3, 2011

(54) DIODE SMART TRACK

(75) Inventors: Francesco Marraccini, Munich (DE); Antonello Arigliano, Kaufering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 12/586,046

(22) Filed: Sep. 16, 2009

(65) Prior Publication Data

US 2011/0057825 A1    Mar. 10, 2011

(30) Foreign Application Priority Data

Sep. 8, 2009  (EP) .................................... 09368028

(51) Int. Cl.
*H03M 1/00*    (2006.01)
(52) U.S. Cl. ........................................ 341/138; 341/136
(58) Field of Classification Search .................. 341/138, 341/136, 144, 145, 119; 250/214.1, 288.1
See application file for complete search history.

(56) References Cited

U.S. PATENT DOCUMENTS

| | | | |
|---|---|---|---|
| 4,350,974 A | 9/1982 | Gordon et al. | |
| 4,494,084 A | 1/1985 | Hughes | |
| 5,686,823 A | 11/1997 | Rapp | |
| 6,208,278 B1 * | 3/2001 | Toosky | 341/138 |
| 7,078,668 B2 | 7/2006 | Yamazaki et al. | |
| 2006/0290415 A1 | 12/2006 | Hazucha et al. | |
| 2007/0228170 A1 | 10/2007 | Pettinelli, Jr. et al. | |
| 2007/0236420 A1 | 10/2007 | Huang et al. | |
| 2008/0191644 A1 | 8/2008 | Liu | |
| 2008/0204291 A1 | 8/2008 | Christ | |

FOREIGN PATENT DOCUMENTS

| | | |
|---|---|---|
| JP | 57037221 | 3/1982 |
| JP | 2006-180291 | 7/2006 |

OTHER PUBLICATIONS 09368028.8-2206, European Search Report, Mar. 9, 2010, Dialog Semiconductor GmbH.

* cited by examiner

*Primary Examiner* — Joseph Lauture
(74) *Attorney, Agent, or Firm* — Saile Ackerman LLC; Stephen B. Ackerman

(57) ABSTRACT

Systems and methods to achieve a logarithmic digital-to-analog converter (DAC), which is easy to be implemented, and requiring reduced chip space have been disclosed. The logarithmic DAC is created by a simple and easy to scale linear DAC, which is linearly scaling a predefined voltage range. The output voltage of the linear DAC is converted to a logarithmic current value directly by the voltage-current characteristic of an integrated diode.

20 Claims, 3 Drawing Sheets

DIODE SMART TRACK

BACKGROUND OF THE INVENTION (1) Field of the Invention

This invention relates generally to digital-to-analog converters and relates more specifically to logarithmic digital-to-analog converters.

(2) Description of the Prior Art

Logarithmic Digital-to-Analog converters (DACs) are required in a number of applications such as biasing LEDs.

Main disadvantage of prior art solutions for logarithmic DACs is the way to implement the linear to exponential conversion. Each current step value has to be calculated using a mathematical formula and it is implemented by adjusting the linear steps based on mathematical calculation. Especially higher resolution DACs require very accurate matching and therefore a large chip area. The complexity of prior art solutions and the chip-area occupied thereof increases exponentially as the resolution increases.

It is a challenge for the designers of logarithmic DACs to achieve simple solutions, which are easy to be implemented.

There are known patents or patent publications dealing with startup circuits for logarithmic DACs.

U.S. Patent Publication (US 2008/0204291 to Christ) proposes embodiments of a digital-to-analog converter (DAC) with a logarithmic response and methods for converting digital signals to analog. Other embodiments are described and claimed. In some embodiments, the DAC includes a wedge-shaped resistive array having a plurality of linearly spaced contact nodes and a switching array to selectively couple one of the contact nodes with an analog output based on a control signal. Each of the contact nodes may provide a corresponding reference voltage that varies logarithmically with respect to the linearly spaced contact nodes.

U.S. Patent (U.S. Pat. No. 6,208,278 to Toosky) discloses a digital to analog conversion. According to an embodiment of the present invention, a logarithmic transfer characteristic may be produced by subtracting a fraction of the output current to a reference current in a recursive equation. A reference current enters a circuit and flows through a transistor.

U.S. Patent (U.S. Pat. No. 7,078,668 to Yamazaki et al.) describes a photoelectric conversion apparatus including a photoelectric conversion element and a logarithmic conversion unit for converting a signal from the photoelectric conversion element to a logarithmically compressed voltage by means of a diode characteristic of p-n junction.

SUMMARY OF THE INVENTION

A principal object of the present invention is to achieve a process compensated logarithmic DAC having a reduced complexity and reduced chip-area requirements.

A further object of the invention is to achieve a logarithmic DAC using a simple and easy to scale a linear DAC wherein the output voltage of the DAC is converted to a logarithmic current directly by the voltage-current characteristic of an integrated diode.

A further object of the invention is to achieve a logarithmic DAC which is immune to process and temperatures variations.

A further object of the invention is to achieve a logarithmic DAC wherein a voltage range for the linear DAC is created by two integrated diodes, which are driven by a predefined current to set a maximum and a minimal current limit for the output current.

A further object of the invention is to achieve a logarithmic DAC using a voltage-current characteristic of a diode to generate a linear to exponential current conversion, changing linearly the drop voltage across the diode.

In accordance with the objects of this invention a method for a logarithmic DAC that is easy to be implemented and requiring reduced chip space, has been achieved. The method invented comprises the steps of (1) providing a linear DAC and a diode D1 at the output of the linear DAC, (2) setting a minimum and a maximum reference input voltage of the DAC corresponding to a minimum and a maximum output voltage of the DAC, and (3) converting a digital input of the linear DAC to an output voltage of the DAC within a range defined by said minimum and maximum reference input voltage. Finally the method comprises the step of (4) applying the linear voltage output of the DAC across the diode in order to convert the linear voltage to a logarithmic current directly by the voltage-current characteristic of the diode.

In accordance with the objects of this invention a logarithmic DAC, which is easy to be implemented and requiring reduced chip space, has been achieved. The logarithmic DAC invented comprises a linear DAC having inputs and an output, wherein a first input is a reference voltage defining a maximum analog output voltage, a second input is a voltage defining a minimum analog output voltage and a third input is a digital input defining a value to be converted to an analog output voltage, and the output is said analog voltage, and a diode, wherein said output voltage is applied across said diode, converting said output voltage to a logarithmic current according to a voltage-current characteristic of the diode.

BRIEF DESCRIPTION OF THE DRAWINGS

In the accompanying drawings forming a material part of this description, there is shown.

DESCRIPTION OF THE PREFERRED EMBODIMENTS

Circuits and methods for a logarithmic digital-to-analog converter (DAC) that is easy to be implemented and immune to process and temperature variations have been achieved. The output voltage of a linear DAC is converted to a logarithmic current value directly by the voltage-current characteristic of an integrated diode.

Figure 1:
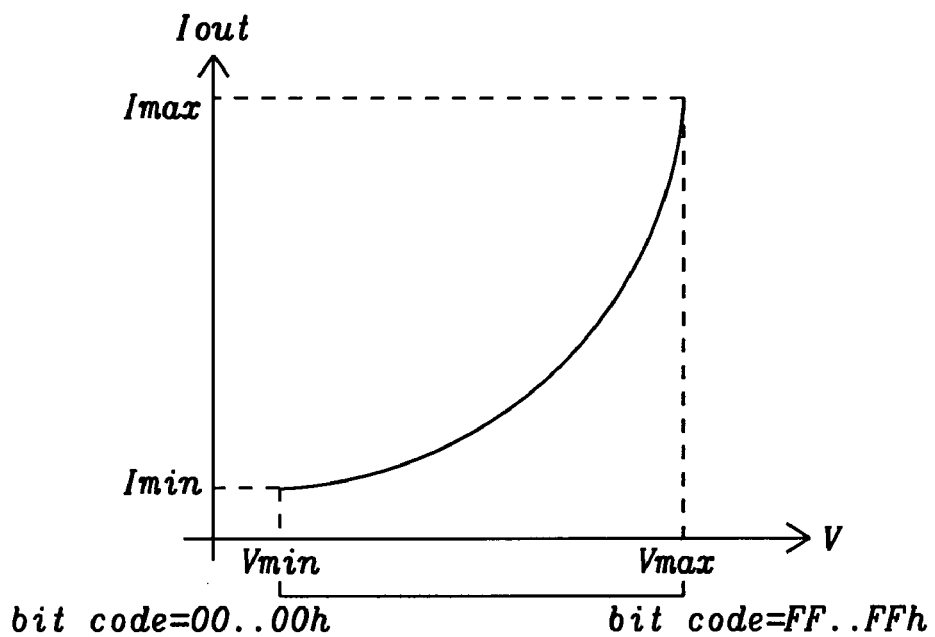
FIG. 1 illustrates a voltage-current characteristic of a semiconductor diode if a forward bias voltage is applied across the diode.

FIG. 1 illustrates a voltage-current characteristic of a semiconductor diode if a forward bias voltage is applied across the diode. In this case the current through the diode, when forward biased, is proportional to the square of the applied voltage. A bit code of a sequence of only "zeros" corresponds to a minimum voltage $V_{min}$ applied across the diode and hence to a minimum current $I_{min}$ through the diode. A bit code of a sequence comprising only "1s" corresponds to a maximum voltage $V_{max}$ applied to the diode and hence to a maximum current $I_{max}$, as outlined by FIG. 2 below.

Figure 2:
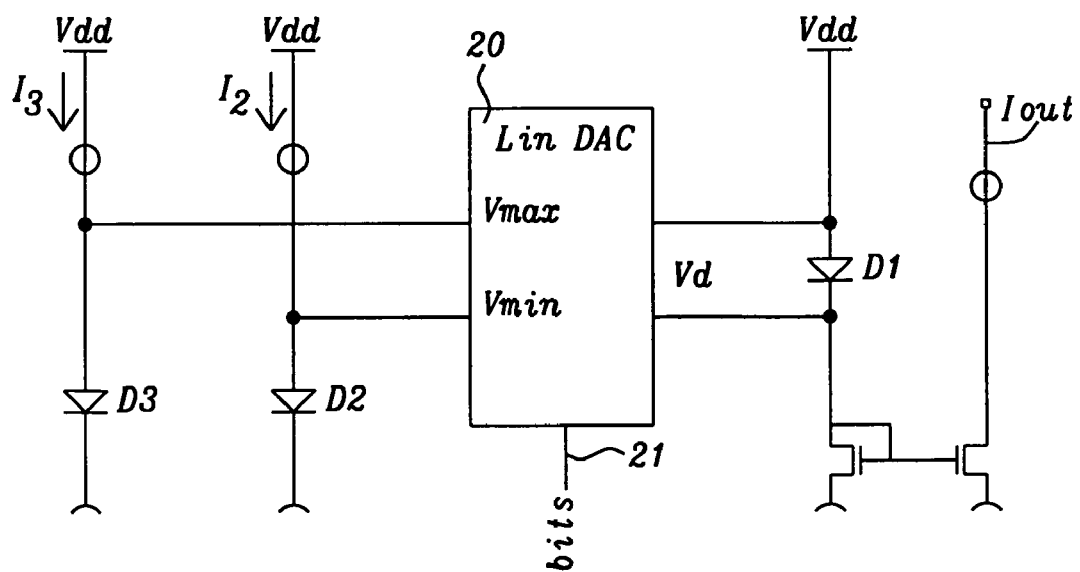
FIG. 2 shows the basic components of a preferred embodiment of the present invention.

FIG. 2 shows the basic components of a preferred embodiment of the present invention. A main objective of the present invention is to achieve a current source generating a current $I_{out}$, which is exponentially dependent upon a value of an incoming bit stream 21, wherein the current $I_{out}$ generated by said current source has a range between a minimum current $I_{min}$ and a maximum current $I_{max}$.

A linear DAC 20 has inputs comprising a bit stream 21, to be linearly converted to an analog output voltage $V_d$, a maximum reference voltage $V_{max}$ and a minimum reference voltage $V_{min}$. The output voltage $V_d$ has a range between $V_{max}$ and $V_{min}$. The reference voltages $V_{max}$ and $V_{min}$ are generated by correspondent current sources $I_3$ and $I_2$ generating each a correspondent current through diode D2 or correspondingly through diode D3. The diodes D3 and D2 are biased by the reference currents $I_3$ and $I_2$ in order to generate the reference voltages $V_{max}$ and $V_{min}$. The reference currents $I_3$ and $I_2$ correspond to the maximum and minimum currents $I_{max}$ and $I_{min}$ generated by the output voltage $V_d$ across diode D1.

The relationship between I2 and I3 to $I_{min}$ and correspondingly to $I_{max}$ can be described by the equations:

$$I2 = I_{min}/m \text{ and } I3 = I_{max}/n$$

if D1=m×D2, and D1=n×D3,
wherein m describes the relation of size of D1 to D2 and n describes the relation of size of D1 to D3.

In order to generate the minimum and maximum current with the I-V characteristic of diode D1, I need to apply directly across the device the reference voltages $V_{max}$ and $V_{min}$ are applied across the diode D1. These two voltages define the $I_{min}$ and $I_{max}$ values of the output current. In a preferred embodiment diodes D1, D2 and D3 are matching diodes.

The output voltage $V_d$ of the linear DAC 20 is applied as drop voltage across diode D1 in a range between $V_{max}$ and $V_{min}$, generating a current, which is exponentially dependent on the output voltage $V_d$ and having a range between $I_{max}$ and $I_{min}$.

The approach of the present invention does only rely on matching of the tree diodes D1, D2 and D3 and does not require absolute process parameters of the three diodes.

The output current $I_{out}$ follows the equation $$Iout = Is * e^{\frac{V_{min} + \sum_{k=0}^{n-1} \frac{V_{max} - V_{min}}{2^n - 1} * 2^k * b_k}{Vt}},$$

wherein n signifies the number of bits of the digital input of the DAC, $I_s$ signifies the reverse saturation current of the diode D1 and Vt is the absolute thermal voltage. "bk" is a bit value that can be 0 or 1. the coefficient "k" is the index of the bit that can change from 0 to n−1 in the formula. If all the bits are 0, we have the minimum current value Imin=Is exp (Vmin/Vt), while, if all the bits are 1, we have the maximum value Imax=Is exp (Vmax/Vt).

In summary,
a bit code=00 . . . 0000h generates a DAC output voltage $V_d = V_{min}$ generating an output current $I_{out} = I_{min}$, and
a bit code=FF . . . FFFh generates a DAC output voltage $V_d = V_{max}$ generating an output current $I_{out} = I_{max}$.

It should be noted that, if required by target accuracy, trimming bits could be introduced.

Figure 3:
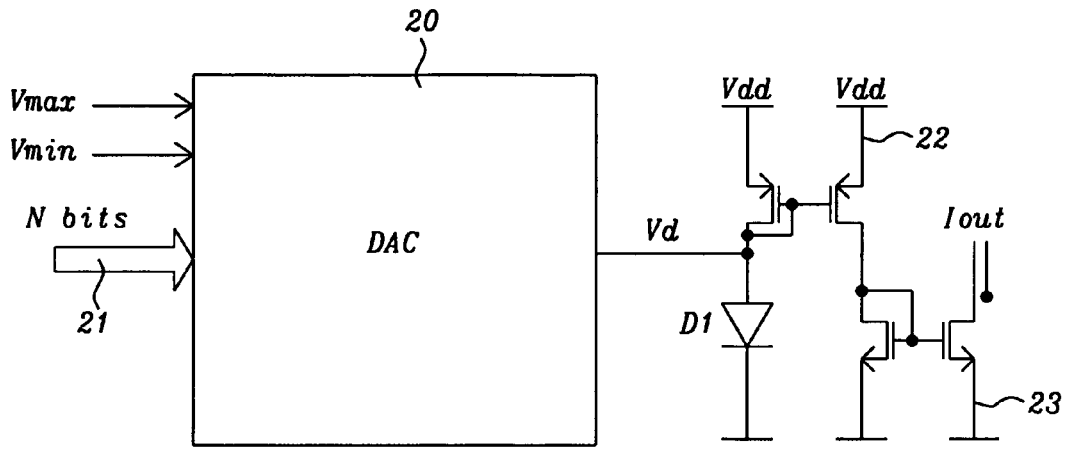
FIG. 3 shows another embodiment of the present invention using two current mirrors in order to mirror the current through diode D1 to a second branch of the output circuitry and then to a third branch wherein an output current $I_{out}$ flows through the third branch.

FIG. 3 shows another embodiment of the present invention using two current mirrors in order to mirror the current through diode D1 to a second branch 22 of the output circuitry and then to a third branch 23 wherein an output current $I_{out}$ flows through the third branch.

Two current mirrors are deployed in the circuit of FIG. 3 because for some applications, as e.g. a LED string driven by the output current, where the voltage at the top of the string is regulated by a boost DC because for some applications, we want to drive with the output current, a LED string, where the voltage at the top of the string is regulated by a boost DC/DC converter, that is regulating the voltage depending on the current setting that flows into the LED string. In such applications an output current as shown in FIG. 3 is required.

Figure 5:
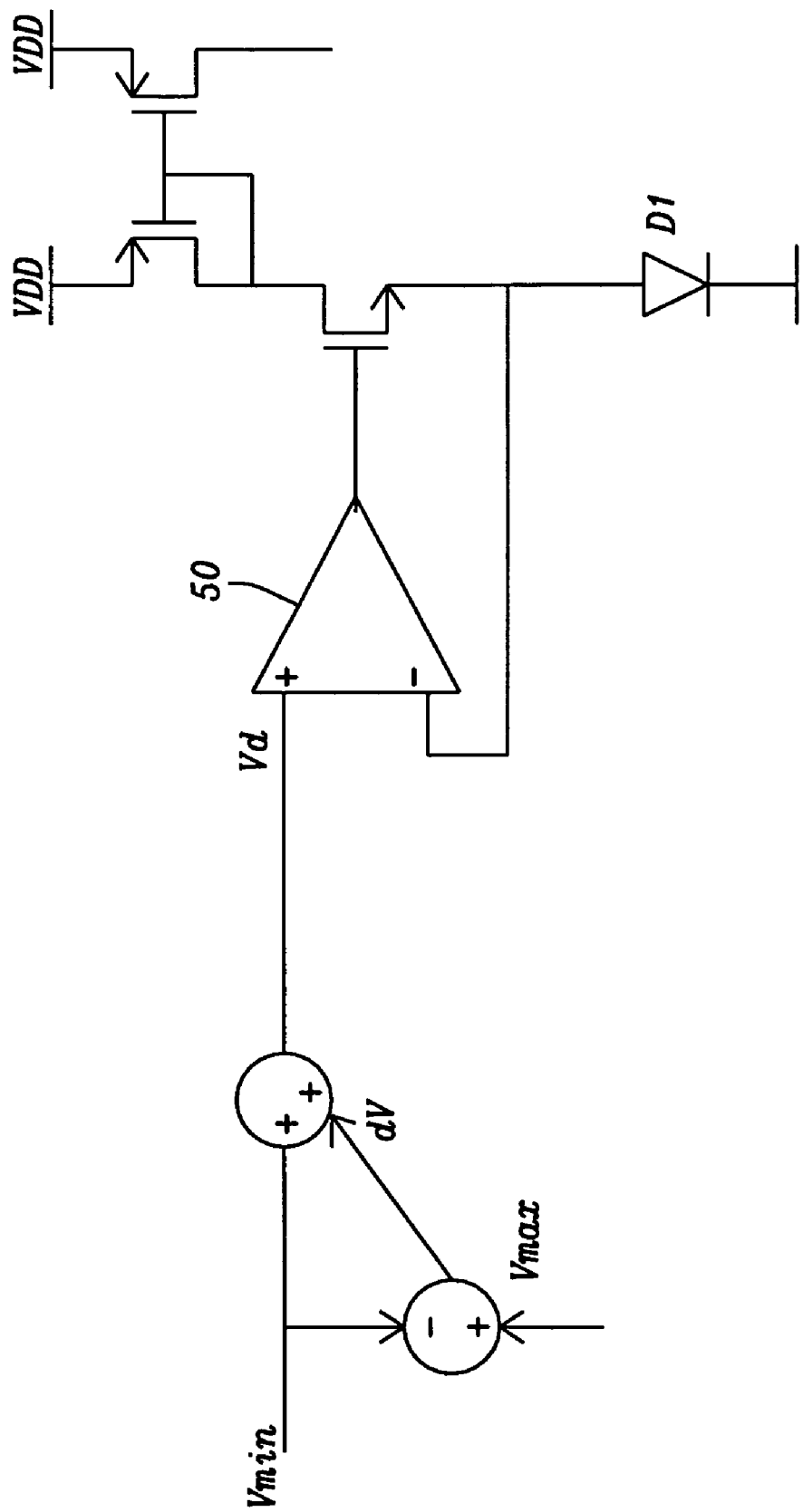
FIG. 5 shows in more details a preferred embodiment of a circuit to control the voltage across the diode as constant as possible to reach with very high accuracy a current output value.

FIG. 5 shows in more details a preferred embodiment of a circuit to control the voltage across the diode as constant as possible to reach with very high accuracy a current output value. FIG. 5 shows the circuit methodology used to generate the drop voltage needed to apply across the diode D1, depending on the reference input voltages of the DAC $V_{max}$ and $V_{min}$. The output voltage of the DAC Vd amounts to a sum of $V_{min}$+dV, wherein dV is a linear increment of the output of the linear DAC (the drop voltage across the Diode D1 is changing linearly).

The output voltage of the DAC increases linearly in steps of dV, changing according the input bits, from $V_{min}$ to $V_{max}$.

The object of the circuit of FIG. 5 is to use amplifier 50 to control the voltage across the diode D1 as constant as possible to reach with very high accuracy the current output value. The amplifier applies the voltage Vd from the DAC to the Diode D1.

Figure 4:
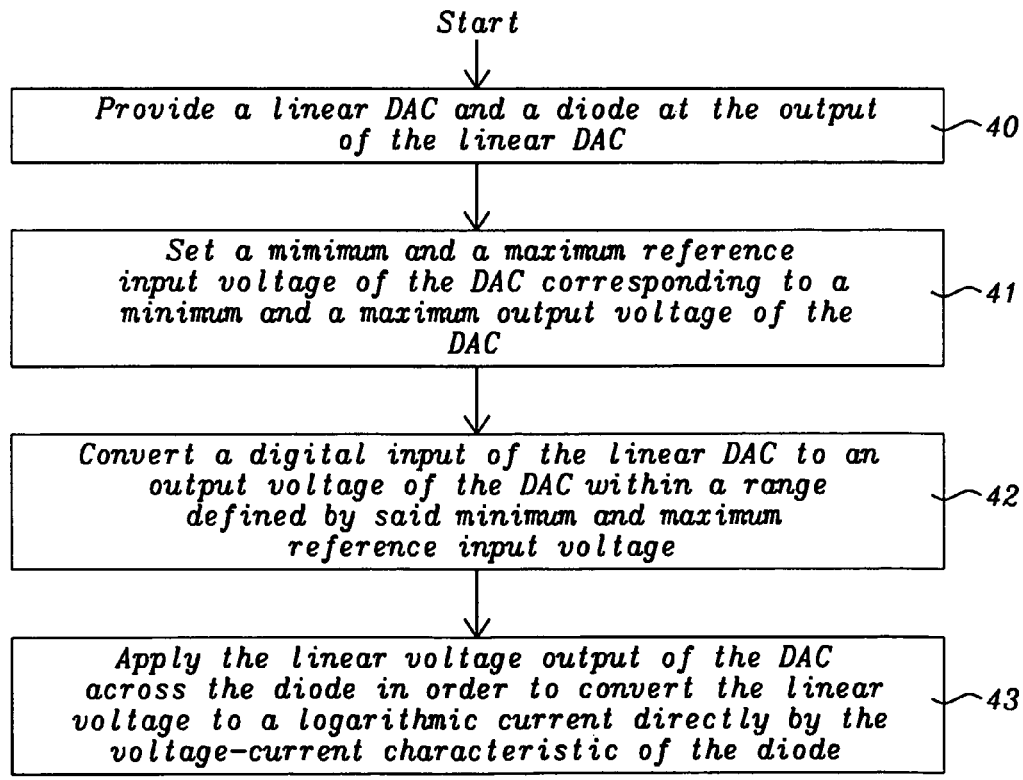
FIG. 4 illustrates a flowchart of a method invented for a logarithmic DAC that is easy to be implemented and requiring reduced chip space.

FIG. 4 illustrates a flowchart of a method invented for a logarithmic DAC that is easy to be implemented and requiring reduced chip space. A first step 40 describes the provision of a linear DAC and a diode at the output of the linear DAC. A next step 41 illustrates setting a minimum and a maximum reference input voltage of the DAC corresponding to a minimum and a maximum output voltage of the DAC. Step 42 describes converting a digital input of the linear DAC to an output voltage of the DAC within a range defined by said minimum and maximum reference input voltage. Step 43 discloses applying the linear voltage output of the DAC across the diode in order to convert the linear voltage to a logarithmic current directly by the voltage-current characteristic of the diode.

While the invention has been particularly shown and described with reference to the preferred embodiments thereof, it will be understood by those skilled in the art that various changes in form and details may be made without departing from the spirit and scope of the invention.

What is claimed is:

1. A method for a logarithmic DAC, which is easy to be implemented, and requiring reduced chip space, comprising the following steps:
   (1) providing a linear DAC and a diode D1 at the output of the linear DAC;
   (2) setting a minimum and a maximum reference input voltage of the DAC corresponding to a minimum and a maximum output voltage of the DAC;
   (3) converting a digital input of the linear DAC to an output voltage of the DAC within a range defined by said minimum and maximum reference input voltage; and (4) applying the linear voltage output of the DAC across the diode in order to convert the linear voltage to a logarithmic current directly by the voltage-current characteristic of the diode.

2. The method of claim 1 wherein said minimum reference input voltage is generated by a reference current I2 flowing through a diode D2 which is matched to said diode D1 at the output of the DAC.

3. The method of claim 2 wherein said reference current I2 is generated by a current source and is set according to an equation $$I2=I_{min}/m,$$

wherein $I_{min}$ is a minimum output current flowing through said output diode and m describes the relation of size of said diodes D1 to D2.

4. The method of claim 3 wherein said diodes D1 and D2 are matched diodes.

5. The method of claim 1 wherein said maximum reference input voltage is generated by a reference current I3 flowing through a diode D3 which is matched to said diode D1 at the output of the DAC.

6. The method of claim 5 wherein said reference current I3 is generated by a current source and is set according to an equation $$I3=I_{max}/n,$$

wherein $I_{max}$ is a maximum output current flowing through said output diode and n describes the relation of size of said diodes D1 to D3.

7. The method of claim 5 wherein said diodes D1 and D3 are matched diodes.

8. The method of claim 1 wherein said logarithmic current is mirrored to a second branch of an output circuitry.

9. The method of claim 8 wherein said current mirrored to the second branch is mirrored again to a third branch.

10. The method of claim 1 wherein an amplifier is used to control the voltage across the diode D1 as constant as possible to reach with very high accuracy the current output value.

11. A logarithmic DAC, which is easy to be implemented and requiring reduced chip space comprises:
 a linear DAC having inputs and an output, wherein a first input is a reference voltage defining a maximum analog output voltage, a second input is a voltage defining a minimum analog output voltage and a third input is a digital input defining a value to be converted to an analog output voltage, and the output is said analog voltage; and
 a diode, wherein said output voltage is applied across said diode, converting said output voltage to a logarithmic current according to a voltage-current characteristic of the diode.

12. The logarithmic DAC of claim 11 wherein said minimum reference input voltage is generated by a reference current I2 flowing through a diode D2 which is matched to said diode D1 at the output of the DAC.

13. The logarithmic DAC of claim 12 wherein said reference current I2 is generated by a current source and is set according to an equation $$I2=I_{min}/m,$$

wherein $I_{min}$ is a minimum output current flowing through said output diode and m describes the relation of size of said diodes D1 to D2.

14. The logarithmic DAC of claim 13 wherein said diode D2 is an integrated diode in a circuit of said linear DAC.

15. The logarithmic DAC of claim 11 wherein said maximum reference input voltage is generated by a reference current I3 flowing through a diode D3 which is matched to said diode D1 at the output of the DAC.

16. The logarithmic DAC of claim 15 wherein said reference current I3 is generated by a current source and is set according to an equation $$I3=I_{max}/n,$$

wherein $I_{max}$ is a maximum output current flowing through said output diode and n describes the relation of size of said diodes D1 to D3.

17. The logarithmic DAC of claim 15 wherein said diode D3 is an integrated diode in a circuit of said linear DAC.

18. The logarithmic DAC of claim 11 wherein said logarithmic current is mirrored to a second branch of an output circuitry.

19. The logarithmic DAC of claim 18 wherein said current mirrored to the second branch is mirrored again to a third branch.

20. The logarithmic DAC of claim 11 wherein an amplifier is used to control the voltage across the diode D1 as constant as possible to reach with very high accuracy the current output value.

* * * * *